US007016019B2

(12) United States Patent
Van Den Biggelaar et al.

(10) Patent No.: US 7,016,019 B2
(45) Date of Patent: Mar. 21, 2006

(54) LITHOGRAPHIC APPARATUS AND DEVICE MANUFACTURING METHOD

(75) Inventors: Petrus Marinus Christianus Maria Van Den Biggelaar, Nuenen (NL); Henrikus Herman Marie Cox, Eindhoven (NL); Yin Tim Tso, Eindhoven (NL); Sjoerd Nicolaas Lambertus Donders, 's-Hertogenbosch (NL); Theodorus Knoops, Asten (NL)

(73) Assignee: ASML Netherlands B.V., Veldhoven (NL)

( * ) Notice: Subject to any disclaimer, the term of this patent is extended or adjusted under 35 U.S.C. 154(b) by 155 days.

(21) Appl. No.: 10/735,846

(22) Filed: Dec. 16, 2003

(65) Prior Publication Data

US 2005/0128460 A1 Jun. 16, 2005

(51) Int. Cl.
*G03B 27/58* (2006.01)
*G03B 27/42* (2006.01)

(52) U.S. Cl. .......................................... 355/72; 355/53
(58) Field of Classification Search .................. 355/53, 355/72–76; 310/10, 12; 318/560, 561, 619; 700/32, 38, 188
See application file for complete search history.

(56) References Cited

U.S. PATENT DOCUMENTS

| 6,216,058 | B1 | 4/2001 | Hosek et al. |
| 6,260,282 | B1 | 7/2001 | Yuan et al. |
| 6,294,891 | B1 * | 9/2001 | McConnell et al. ........ 318/619 |
| 6,320,345 | B1 | 11/2001 | Yuan et al. |
| 6,411,365 | B1 | 6/2002 | Takeishi |
| 6,509,953 | B1 | 1/2003 | Saiki et al. |
| 6,580,245 | B1 * | 6/2003 | Quaschner et al. ......... 318/560 |
| 6,809,798 | B1 * | 10/2004 | Fujita ........................... 355/53 |
| 2001/0000974 | A1 | 5/2001 | Hazelton et al. |
| 2001/0021009 | A1 | 9/2001 | Yuan et al. |
| 2003/0060921 | A1 | 3/2003 | Wiener |
| 2003/0108415 | A1 | 6/2003 | Hosek et al. |
| 2004/0098160 | A1 | 5/2004 | Galburt et al. |
| 2004/0135534 | A1 * | 7/2004 | Cullen ........................ 318/609 |

FOREIGN PATENT DOCUMENTS

| EP | 0 785 571 B1 | 10/2000 |
| EP | 1 052 550 A2 | 11/2000 |
| EP | 1 372 037 A2 | 12/2003 |
| EP | 1 422 569 A2 | 5/2004 |
| JP | 2000-40658 | 2/2000 |
| JP | 2000-106340 | 4/2000 |
| WO | WO 2002/31597 A1 | 4/2002 |

* cited by examiner

*Primary Examiner*—Henry Hung Nguyen
(74) *Attorney, Agent, or Firm*—Pillsbury Winthrop Shaw Pittman LLP

(57) ABSTRACT

In a lithographic projection apparatus and a device manufacturing method, a movable part is controlled to produce a motion, an absolute value of at least one of a fourth and a higher derivative to time of the position of the motion being limited to less than a maximal value. Specifying at least one of a fourth and a higher derivative to time of the position may help to improve settling behavior to obtain more accurate positioning. Further, a movable part may be controlled to produce an acceleration of the movable part having a high at least one of a third and a higher derivative to time of the position of the motion at a start portion of the acceleration and a corresponding low at least one of a third and a higher derivative to time of the position of the motion at an end portion of the acceleration, the absolute value of the high at least one of the third and the higher derivative to time of the position of the motion being larger than the absolute value of the corresponding low at least one of the third and the higher derivative to time of the position of the motion.

52 Claims, 10 Drawing Sheets

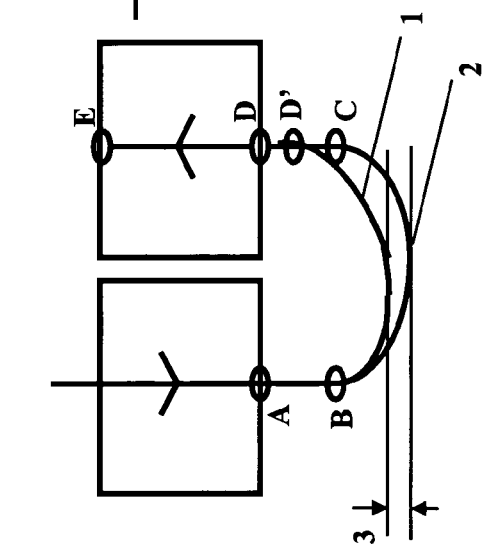
FIG. 9a
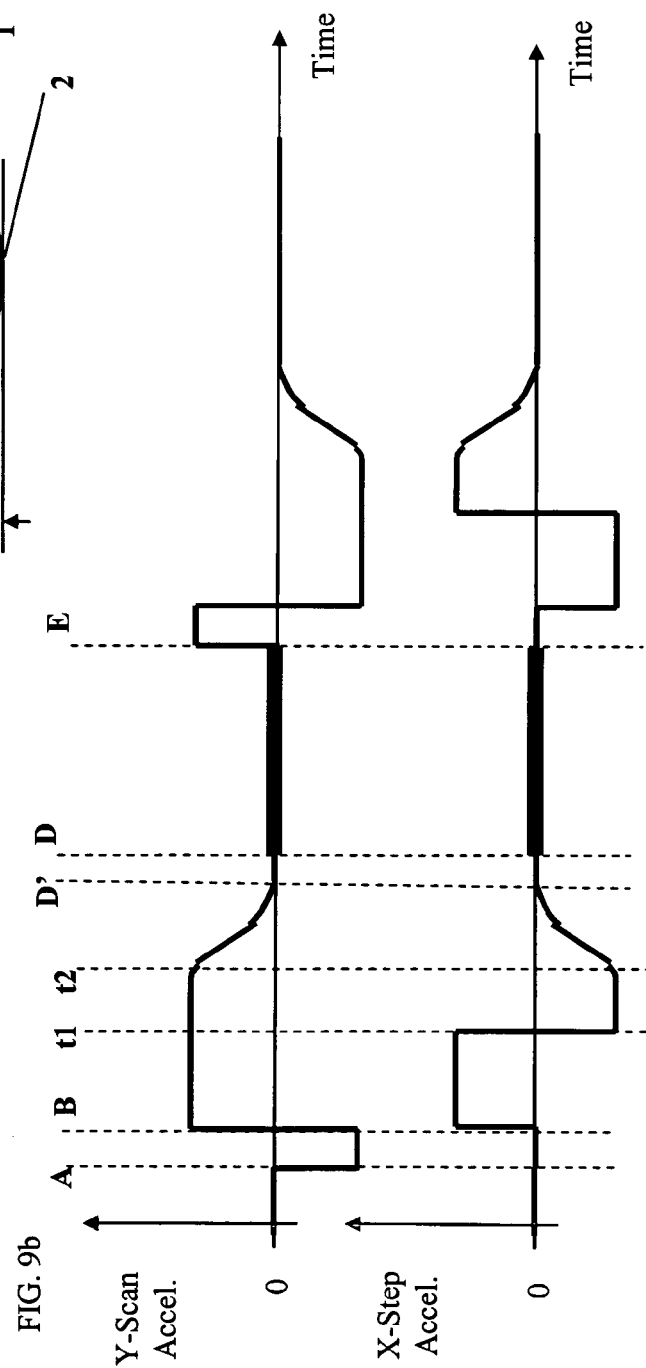
FIG. 9b
FIG. 9c

LITHOGRAPHIC APPARATUS AND DEVICE MANUFACTURING METHOD

FIELD

The present invention relates to high precision positioning of a movable part.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies or fields) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in at one time, and so-called scanners, in which each target portion is irradiated by scanning the pattern through the projection beam in a given direction (the "scanning"-direction) while synchronously scanning the substrate parallel or anti-parallel to this direction.

Many industrial processes, such as lithography, involve motion of a movable part along a trajectory that is defined by precise positions at specific times, e.g., set-points. Typically, the motion is performed by a closed loop controlled servo system comprising a motor with an amplifier, mechanics to be actuated (e.g., a slider), a position (and or velocity) sensor, a feedback and feed-forward controller and a set point generator. The motor receives the input from the controller that calculates the motor input as a function of the difference between the set point position and the measured actual position. Feedback control ensures that the actual position will become equal to the desired commanded set point position. Feedback control also can ensure the system's performance to be less sensitive to process uncertainties and disturbances.

A method for determining set-point data for such a movable part can be referred to as 'trajectory planning' and the resulting set-point data can be referred to as the 'trajectory'. Typically motion signals to be applied to one or more actuators, e.g., one or more linear or planar motors, of the movable part are determined from the set-point data of the trajectory although not necessary in all circumstances. The motion signals, e.g. set-point signals, are then applied to the actuator to move the movable part to the desired positions.

An important aspect of trajectory planning is the 'settling behavior', i.e., the settling period. After a trajectory has reached an end or intermediate position, it takes a certain amount of time before the actual position is close enough to the required position. So, for example, after changing position, the system needs some "settling time" to reach the required positional accuracy. A similar observation can be made for a substantially constant velocity phase of a motion. During an acceleration (whether positive or negative), it takes a certain time for the velocity to settle to a substantially constant value. So, when considering high accuracy motion control, it is usually necessary to specify a 'settling period', the duration of which is determined by the settling behavior, which is a function of, among other possible things, the control loop, the applied acceleration and jerk, process uncertainties and disturbances, and by the required accuracy of positioning. Improvement of the settling behavior will result in a shorter duration of the settling period.

As an example, motion trajectories are often applied to the substrate and mask in a step-and-scan lithography apparatus. In a typical such apparatus, the substrate surface is exposed in a sequence of field scans. The exposure of each field requires that the substrate and mask be simultaneously scanned at precisely synchronized, substantially constant velocities. After each field exposure, the substrate stage is stepped from an initial state (i.e., a position and velocity) at the end of a field scan, to a new state (i.e., a new position and typically same velocity) at the start of the next field scan. Similarly, the mask stage is also stepped from an initial state at the end of a field scan, to a new state at the start of the next field scan.

To maximize processing of substrates per unit time in a lithographic apparatus, i.e., substrate throughput, it is desirable to expose a substrate in the minimum possible time. However, a lithographic apparatus also requires high precision positioning of the substrate and the mask. Accordingly, the object tables supporting the mask and/or the substrate should be moved smoothly, particularly during critical phases such as exposure, to produce a minimum amount of vibration in the lithographic apparatus. The unavoidable acceleration (whether positive or negative) of the object tables can produce vibrations in the lithographic apparatus that take a significant "settling time" before the position or velocity error is within the required accuracy.

FIGS. 2a to 2d show respectively example position, velocity, acceleration, and jerk trajectory profiles of an object table during an example conventional scan. The Y axis of each of FIGS. 2a to 2d represent the position, velocity, acceleration, and jerk respectively of the object table with respect to time, which is represented along the X axis of each of the Figures.

As shown in FIG. 2a, the object table moves from position 0 to +D between times t0 and t9. As shown in FIG. 2b, the object table moves at a substantially constant velocity +V between times t4 and t6 (the time period for exposure) and is stationary before time t1 and after time t9. As shown in FIG. 2c, the positive acceleration of the object table increases in a linear manner from time t1 until a maximum substantially constant positive acceleration +A is reached at time t2, from times t2 to t3 the object table positively accelerates at maximum positive acceleration +A, and then at time t3 the positive acceleration of the object table reduces until it is back at 0 at time t4. At time t4, the object table has a substantially constant velocity +V (shown in FIG. 2b). At time t6, the negative acceleration of the object table linearly increases from time t6 until a maximum negative acceleration -A is reached at time t7, from times t7 to t8 the object table negatively accelerates at maximum negative acceleration -A, and then at time t8 the negative acceleration of the object table decreases until it is back at 0 at time t9.

As shown in FIG. 2d, the jerk on the object table is at maximum positive jerk +J from times t1 to t2, at maximum negative jerk -J from times t3 to t4, and 0 between times t2 to t3 and times t4 to t6. Similarly, the jerk on the object table is at a maximum negative jerk -J from times t6 to t7, at a maximum positive jerk +J from times t8 to t9, and 0 between times t7 and t8. Thus, there are discontinuities in the jerk at times t1, t2, t3 and t4 (as well as at t6, t7, t8, and t9) which cause discontinuities in the motion of the object table. Such discontinuities and large jerk values can cause vibrations in the lithographic apparatus, vibrations that can have an effect on the accurate positioning of the object table.

Consequently, a settling period is provided between times t4 and t5 (just before exposure) during which vibrations, such as generated during the acceleration (whether positive or negative) of the object table, are allowed to dissipate and the velocity can settle to substantially +V. The amount of settling period the object table requires to reach a substantially constant scanning velocity depends to a large part on the settling behavior that is the result from, among other possible things, the applied acceleration and jerk, an possible feed-forward, the mechanical system properties and the bandwith of the control system. However, the larger the settling period, the larger the time for the object table to complete a repetitive motion and the smaller the throughput of the lithographic apparatus.

SUMMARY

Accordingly, it would be advantageous, for example, to improve settling behavior.

According to an aspect, there is provided a lithographic projection apparatus, comprising:

a support structure configured to hold a patterning device, the patterning device configured to pattern a beam of radiation;

a substrate table configured to hold a substrate;

an actuator configured to move at least one of the support structure and the substrate table;

a controller configured to provide a motion signal to the actuator, the motion signal controlling the actuator to produce a motion of the at least one of the support structure and the substrate table, an absolute value of at least one of a fourth and a higher derivative to time of the position of the motion being limited to less than a maximal value; and a projection system configured to project the patterned beam onto a target portion of the substrate.

According to an aspect, there is provided a lithographic projection apparatus, comprising:

a support structure configured to hold a patterning device, the patterning device configured to pattern a beam of radiation;

a substrate table configured to hold a substrate;

an actuator connected to at least one of the support structure and the substrate table;

a controller configured to provide a motion signal to the actuator, the motion signal controlling the actuator to produce an acceleration of at least one of the support structure and the substrate table having a high at least one of a third and a higher derivative to time of the position of the motion at a start portion of the acceleration and a corresponding low at least one of a third and a higher derivative to time of the position of the motion at an end portion of the acceleration, the absolute value of the high at least one of the third and the higher derivative to time of the position of the motion being larger than the absolute value of the corresponding low at least one of the third and the higher derivative to time of the position of the motion; and a projection system configured to project the patterned beam onto a target portion of the substrate.

According to further aspects, there is provided related methods and computer program products.

Although specific reference maybe made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be-described, by way of example only, with reference to the accompanying schematic drawings in which corresponding reference symbols indicate corresponding parts, and in which:

FIG. 9a depicts a physical depiction of a trajectory according to an embodiment of the invention; and FIGS. 9b–9c depict acceleration trajectory profiles for the physical trajectory of FIG. 9a.

DETAILED DESCRIPTION

Figure 1:
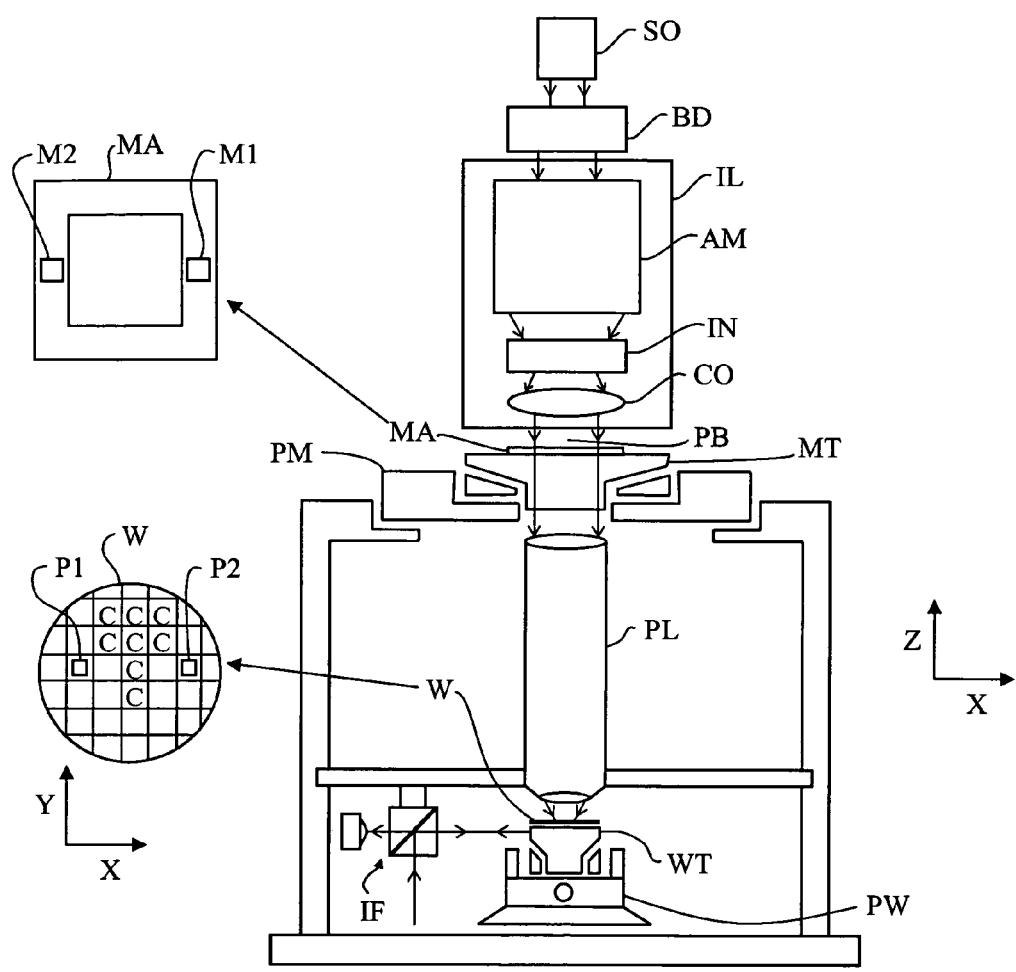
FIG. 1 depicts a lithographic projection apparatus according to an embodiment of the invention.

FIG. 1 schematically depicts a lithographic apparatus according to a particular embodiment of the invention. The apparatus comprises:

- an illumination system (illuminator) IL for providing a projection beam PB of radiation (e.g. UV radiation or EUV radiation).
- a first support structure (e.g. a mask table) MT for supporting a patterning device (e.g. a mask) MA and connected to first positioning device PM for accurately positioning the patterning device with respect to item PL;
- a substrate table (e.g. a wafer table) WT for holding a substrate (e.g. a resist-coated wafer) W and connected to a second positioning device PW for accurately positioning the substrate with respect to item PL; and
- a projection system (e.g. a refractive projection lens) PL for imaging a pattern imparted to the projection beam PB by the patterning device MA onto a target portion C (e.g. comprising one or more dies or fields) of the substrate W.

As here depicted, the apparatus is of a transmissive type (e.g. employing a transmissive mask). Alternatively, the apparatus may be of a reflective type (e.g. employing a reflective mask or a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Next, trajectory planning of a movable part according to an embodiment will be described. As used herein, a movable part is any part (including a subsystem or a device) of an apparatus (such as a lithographic apparatus) that is designed to perform a motion relative to any or all other parts of the apparatus in at least one degree of freedom. At least this degree of freedom is under active control, i.e. a 'controlled motion', which, for example, implies that there is a sensing device from which the position of the movable part along at least said degree of freedom can be obtained with sufficient accuracy, and an actuator capable of changing the position of the movable part in at least this degree of freedom to a desired position typically given by a motion signal. One or more other degrees of freedom of the movable part may also be under active control and may or may not have a motion signal associated with those degree(s) of freedom, or those degree(s) of freedom may be restricted in any sense by a relation with any other part of the apparatus. Such a relation may be formed for instance by a hinge, a bearing or a guide, but is not restricted thereto. As used herein, position includes translational and/or rotational position and accordingly changing the position can include translation and/or rotation as applicable.

Figure 3:
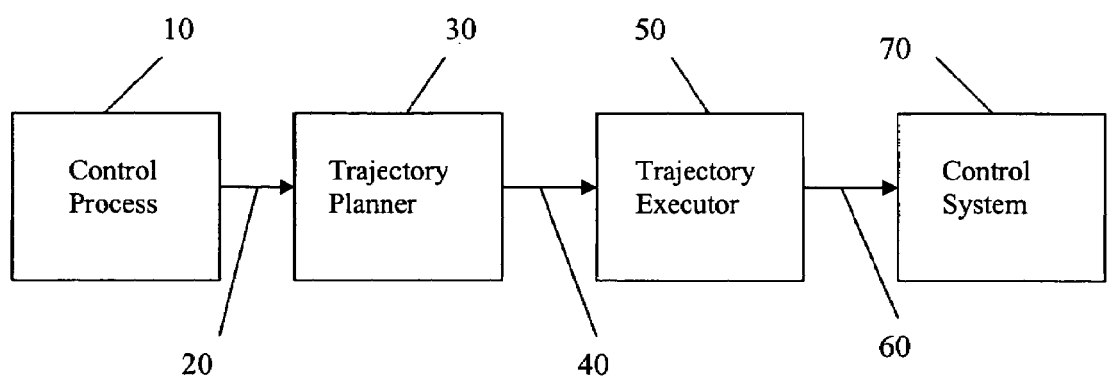
FIG. 3 depicts a schematic configuration of trajectory planning for a movable part of a lithographic apparatus according to an embodiment of the invention.

FIG. 3 depicts a schematic configuration of trajectory planning for a movable part, such as a trajectory for a substrate and/or mask object table, of a lithographic apparatus according to an embodiment. A control process 10 is responsible for providing initial control data 20 regarding the movable part to a trajectory planner 30. Initial control data 20 includes a priori information, used during trajectory planning, about the properties of the trajectory for the movable part. Typical examples of such control data are:
  begin and end position of the movable part;
  starting time and/or stopping time of a movement of the movable part;
  any intermediate position of the movable part that should be obtained at a specific time; and/or
  a velocity of the movable part that must be obtained at a specific time and maintained between two specific positions of the movable part.

In a scanning example, the initial control data 20 includes the starting point of a scan, the distances and velocities of the scan, and stopping points of the scan.

The trajectory planner 30 calculates the required trajectory for the movable part in accordance with control data 20. This design results in the generation by the trajectory planner 30 of a set of motion data 40, typically set-point data as a function of time. Motion data 40 can be viewed as a state signal set that defines a trajectory for the movable part. Set-point data 40 typically includes the definition of quantized time intervals of acceleration of the movable part during the trajectory, as well as the acceleration value(s) during these intervals. Set-point data 40 may also or alternatively include the position and velocity at the start of each acceleration interval. Set-point data 40 may also or alternatively include specific positions of the movable part at a specific times, in which the position is expressed in the form of a set of coordinates, including a coordinate for each degree of freedom under active control. The set of coordinates for the set-point data 40 can be associated with any relevant reference system associated with the movable part in relation to any or all other parts of the apparatus. The trajectory planner 30 typically defines motion of the movable part in a single degree of freedom although the trajectory for other degrees of freedom can also be defined.

In an embodiment, trajectory planner 30 designs the trajectory in an off-line process. Thus, in the case of a lithographic apparatus, motion data 40 is generated prior to commencement of, for example, substrate or mask table scanning operations.

The motion data 40 is then used by the trajectory executor 50. Trajectory executor 50 uses the motion data 40 to produce motion signals 60. Set-point signals 60, a form of motion signal, comprise a series of real-time commands to the control system of the movable part and define positions and accelerations of the movable part. These set-point signals generally correspond to the set-point data 40. The motion signals may comprise $1^{st}$, $2^{nd}$, $3^{rd}$, $4^{th}$, etc. derivatives of the set-point signal. As with the set-point data, the set-point signals also can be expressed in the form of a set of coordinates, including a coordinate for each degree of freedom in which the actuator is capable of changing the position of the movable part. The set of coordinates for the set-point data and the set-point signal can be associated with any relevant reference system. Where, for example, the coordinate system of the set-point data corresponds to that of the movable part in relation to any or all other parts of the apparatus and the coordinate system of the set-point signal corresponds to that of the actuator in relation to any or all other parts of the apparatus, appropriate relation and conversion between the coordinate systems (including that of any sensing device) can be made.

The motion signals 60 are then provided to the control system 70. Control system 70 represents the electromechanical control mechanism used to move the movable part of the lithographic apparatus (e.g., the wafer and/or mask table) according to the motion signals 60. The control system determines the control signals to be applied to the actuator of the movable part. The determination of the control signal may comprise:
  a feed-forward part based on a pre-specified relation between the motion signal and the control signal; and/or
  a feedback part based on a measured value of a characteristic (e.g., position or velocity) of the movable part in relation to a current desired value of that characteristic as specified by the motion signal.

Motion data 40 and motion signals 60 can be considered as being synonymous with the trajectory profiles since in the case of set-point data and set-point signals they merely reflect quantized values of the trajectory profiles. Also, in an embodiment, motion data 40 may be applied directly to the control system without conversion into motion signals 60.

Trajectory planner 30 and/or trajectory executor 50 can be implemented as a computer program product that is processed by a computer or any other hardware. However, the trajectory planner 30 and/or trajectory executor 50 can also be implemented in hardware, firmware or any combination of hardware, firmware and/or software. The hardware, software, firmware or combination thereof for the trajectory planner 30 and/or the trajectory executor 50 maybe generically referred to as a trajectory generator. For example, the trajectory planner 30 and/or the trajectory executor 50 may be implemented in whole or in part in multiple pieces of hardware or in a single piece of hardware, to control one or more degrees of freedom of a movable part. Further, the hardware may comprise the relevant data for the trajectory planner 30 and/or the trajectory executor 50 and/or comprise one or more interfaces to sources of relevant data, e.g., a sensing device and/or a database. The relevant data may be separate from or integrated into a trajectory algorithm of the trajectory planner 30 and/or of the trajectory executor 50 and may be alterable.

In an implementation, a lithographic apparatus comprises: 1) a computer having a trajectory planning and/or execution algorithm (e.g., trajectory planner 30 and/or trajectory executor 50) and relevant data, 2) an interface to obtain any other relevant data for the trajectory planning and/or execution algorithm from a sensing device and/or any other related devices, 3) an interface for transmitting the control signal determined by the trajectory planning and/or execution algorithm, and 4) a converting device to convert the received control signal to one or more physical quantities related to an actuator's capability of changing the position of a movable part in one or more degrees of freedom.

Next, an embodiment of trajectory planning algorithm for a scanning object table of a lithographic projection apparatus will be described. The algorithm can be implemented in the trajectory planner 30. The object table is movable in up to or including six degrees of freedom under active control. The trajectory to be performed comprises an exposure scan in a single linear degree of freedom of the object table while keeping all other degrees of freedom at a substantially constant position coordinate. The scan is specified as follows:

the exposure starts at a given position and time;
the exposure ends at a given position; and
after exposure, the object table must be brought to standstill as quickly as possible.

The actuator for the object table comprises one or more electro-magnetical actuators, such as linear motors, Lorentz motors, planar motors, piezoelectric actuators, etc., capable of exerting forces and torques on the object table. The sensing device for the object table to monitor the position of the object table may comprise a laser interferometer system and one or more cooperating mirror surfaces on the object table. The position of the object table can be determined in up to and including six degrees of freedom using the sensing device.

Figure 4:
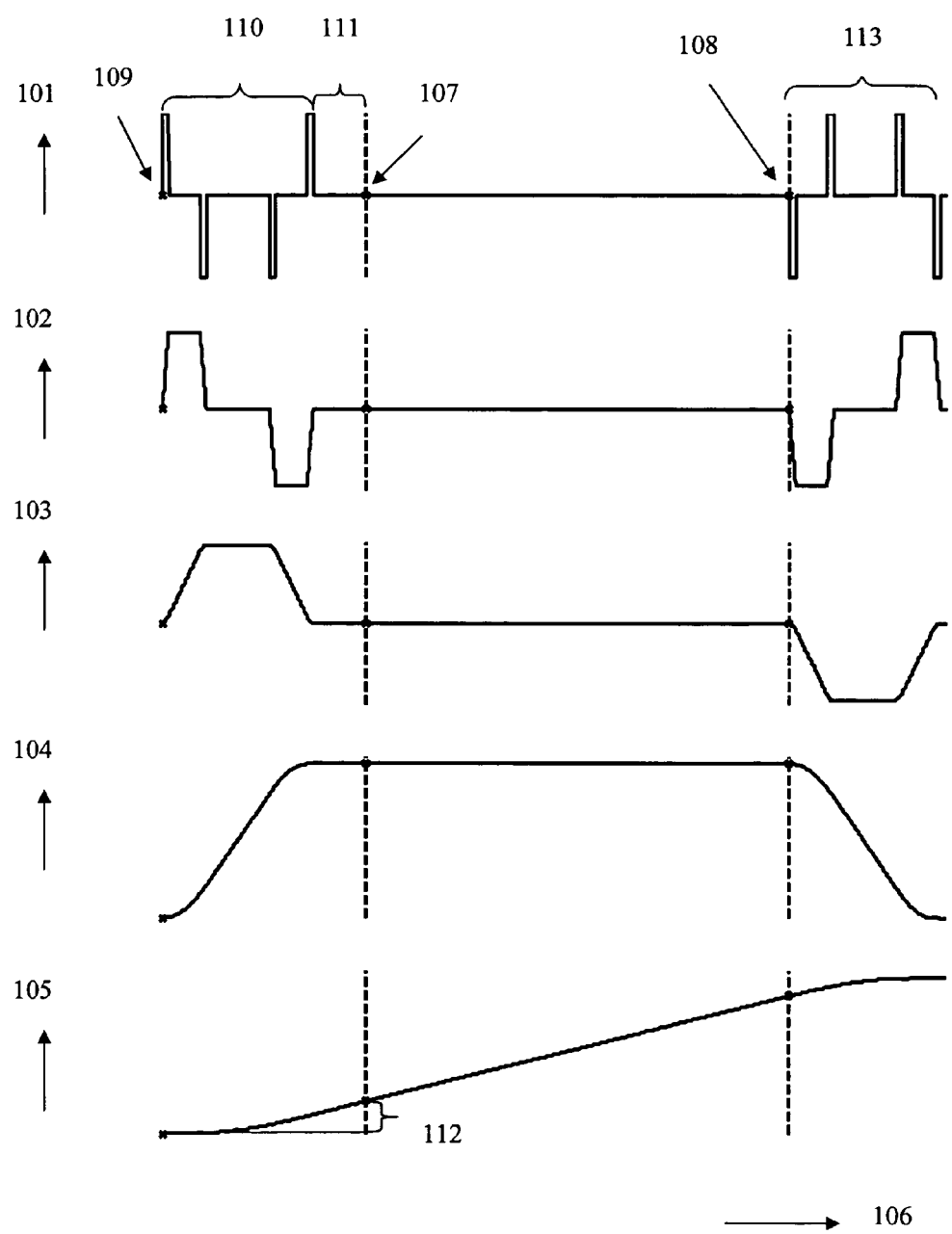
FIG. 4 depicts position, velocity, acceleration, jerk and derivative of jerk trajectory profiles according to an embodiment of the invention.

First, a general form of the trajectory of the object table is established as indicated in FIG. 4. A derivative of jerk profile (fourth derivative to time of the position) 101 as a function of time 106 is specified. The specification of the derivative of jerk profile 101 leads to the specification of the jerk profile 102 (third derivative to time of the position), the acceleration profile 103 (second derivative to time of the position), the velocity profile 104 (the first derivative to time of the position), and the position profile 105 as a function of time 106. In other words, each of the profiles can be generated by integrating the previous profile, starting from the derivative of jerk profile, integrating to the jerk profile, integrating to the acceleration profile, integrating to the velocity profile and integrating to the position profile. In an embodiment, for each degree of freedom of the movable part, a derivative of jerk (fourth derivative to time of the corresponding position coordinate) profile can be specified (and the jerk, acceleration, velocity and positions profiles determined).

The exact time instances at which the derivative of jerk profile changes can be calculated in relation to the exposure start time 107 and the exposure end time 108. If the settling behavior is taken into account, a settling period is specified as a fixed period 111 before exposure starts. During this fixed period, acceleration, jerk and derivative of jerk are zero. The duration of this fixed period should be such that the desired position accuracy can be obtained within the period.

The positive acceleration phase 110 is calculated using one or more maximal (and/or minimal) values for the derivative of jerk profile 101. The trajectory start time 109 can then be calculated, and also the trajectory start position. The latter results from subtracting the displacement 112 from the exposure start position at exposure time 107. Finally, as the maximal (and/or minimal) values defined for the trajectory between the trajectory start time 109 and the exposure start time 107 apply for the entire trajectory, the negative acceleration phase 113 typically will be the mirror image of the positive acceleration phase 110, with equal timing.

The trajectory thus planned has the property that the bounds on the various profiles are all obtained: first the derivative of jerk has a maximal value, then the jerk, then the acceleration, and then the velocity. This will not be the case for all relevant trajectories: for instance, the maximal acceleration may be obtained before the jerk reaches its maximum. Such a case will not be considered here as it is not fundamentally different, but requires a more complex calculation.

From these calculations, the motion data 40 (e.g., set-point data) can be extracted from the position, velocity, acceleration, jerk and/or derivative of jerk profiles. The motion data is then converted to appropriate motion signals 60 provided to the control system 70 of the movable part.

So, by limiting the fourth derivative to time of a motion (set-point) signal by a finite maximum or boundary, a movable part, such as a mask table or a substrate table, may be actuated with improved settling behavior, which allows the use of a short settling period. In other words, by limiting the fourth derivative to time of a motion signal by a finite maximum or boundary, the trajectory of a movable can be smoothed to result in less disturbances, which can lead to reduced settling time.

A further approach to improving position accuracy and/or reducing the settling period is to adjust the trajectory as planned in FIG. 4, such that a smoother trajectory is obtained. A smoother trajectory can be achieved by reducing any or all of the maximal values for the velocity, acceleration, jerk, and/or derivative of jerk profiles. This will lead to an increase in the time required to perform the trajectory, which should be compensated by reducing or removing the settling period due to the smoother trajectory.

To keep the increase in the time required to perform the trajectory low while obtaining an improved result when considering settling time behavior, the maximal values that are reached immediately before the part of the trajectory having high accuracy demands could be reduced. In the case of a scanning object table, the high accuracy part of the trajectory comprises the substantially constant velocity period. It would therefore useful to reduce the maximal values of acceleration, jerk or derivative of jerk immediately before the substantially constant velocity part. Any or all of these maximal values may be reduced. Usually, an effective option is to consider the maximal value of the highest derivative.

Figure 5:
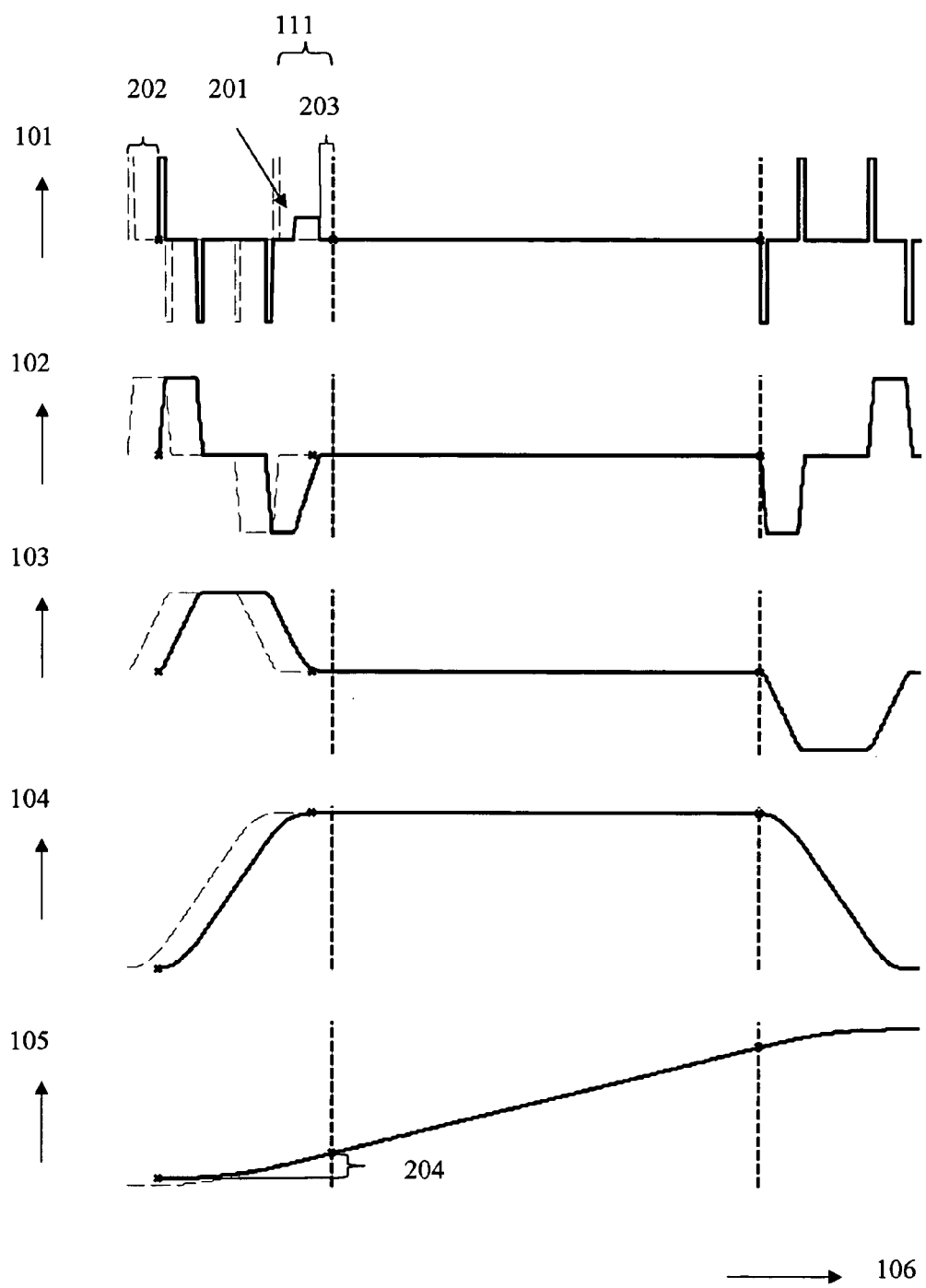
FIG. 5 depicts position, velocity, acceleration, jerk and derivative of jerk trajectory profiles according to an embodiment of the invention, showing the possible effect of temporarily reducing the maximal value of the derivative of jerk.

As an example, FIG. 5 shows the resulting trajectory profiles when the maximal value of the derivative of jerk just before the substantially constant velocity phase is reduced to 25% of the maximum value. This technique may applied to other points in a motion, including stopping points. The maximal value may be reduced to a different percentage, whether lower than 25% (such as 5–10%) or higher than 25%. For comparison, the original trajectory profiles shown in FIG. 4 are indicated in FIG. 5 with a dashed line. As with FIG. 4, the specification of the derivative of jerk profile 101 leads to the specification of the jerk profile 102, the acceleration profile 103, the velocity profile 104, and the position profile 105, as a function of time 106. The temporarily reduced value for the derivative of jerk maximal value is indicated as 201. The timing of the new trajectory is adjusted such that the obtained maximal velocity is equal to that of the original trajectory and that the length of the scan remains equal in both cases. It is assumed that the improvement of the settling behavior is such that the settling period 111 in FIG. 4 can be reduced to the settling period 203 in FIG. 5. The resulting time gain is then found to be period 202. A further advantage of the reduced settling period is that the required run-in displacement 112 in FIG. 4 can be reduced to displacement 204 in FIG. 5. This may result in an additional time gain during a trajectory preceding the current one.

Figure 6:
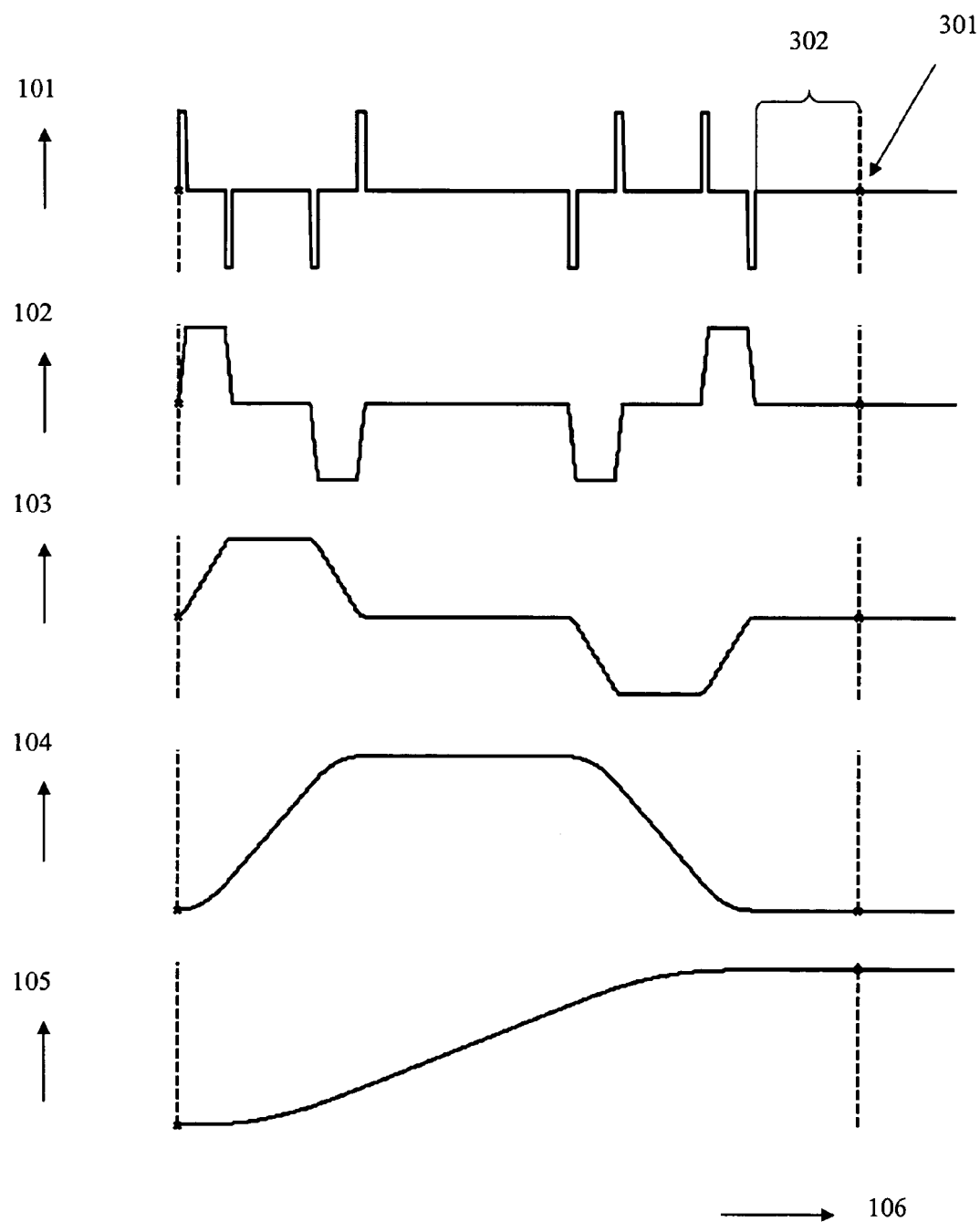
FIG. 6 depicts position, velocity, acceleration, jerk and derivative of jerk trajectory profiles according to another embodiment of the invention.

According to another embodiment, it is assumed that bounds are available on allowable actuator performance, and that these bounds have led to the definition of maximums (and/or minimums) on velocity, acceleration, jerk and derivative of jerk of a trajectory to be planned. The resulting trajectory is given in FIG. 6. Like the trajectory of the embodiment above, the specification of the derivative of jerk profile 101 leads to the specification of the jerk profile 102, the acceleration profile 103, the velocity profile 104, and the position 105, as a function of time 106 as depicted in FIG. 6. In this embodiment, the positional accuracy at the end of the trajectory, indicated by 301, is significant although the positional accuracy may be significant at any point in the trajectory. The settling time period 302 is specified to take settling behavior into account.

Like the trajectory of the embodiment above, the trajectory thus planned has the property that the bounds on the various profiles are all obtained: first the derivative of jerk has a maximal value, then the jerk, then the acceleration, and then the velocity. This will not be the case for all relevant trajectories: for instance, the maximal acceleration may have been obtained before the jerk reaches its maximum. These cases will not be considered here as they are not fundamentally different, but require a more complex calculation.

Further, it may be useful to improve position accuracy and/or reducing the settling period by adjusting the trajectory as planned in FIG. 6, such that a smoother trajectory is obtained. A smoother trajectory can be achieved by reducing any or all of the maximal values for the velocity, acceleration, jerk, and/or derivative of jerk profiles. This will lead to an increase in the time required to perform the trajectory, which should be compensated by reducing or removing the settling period 302 due to the smoother trajectory.

Figure 7:
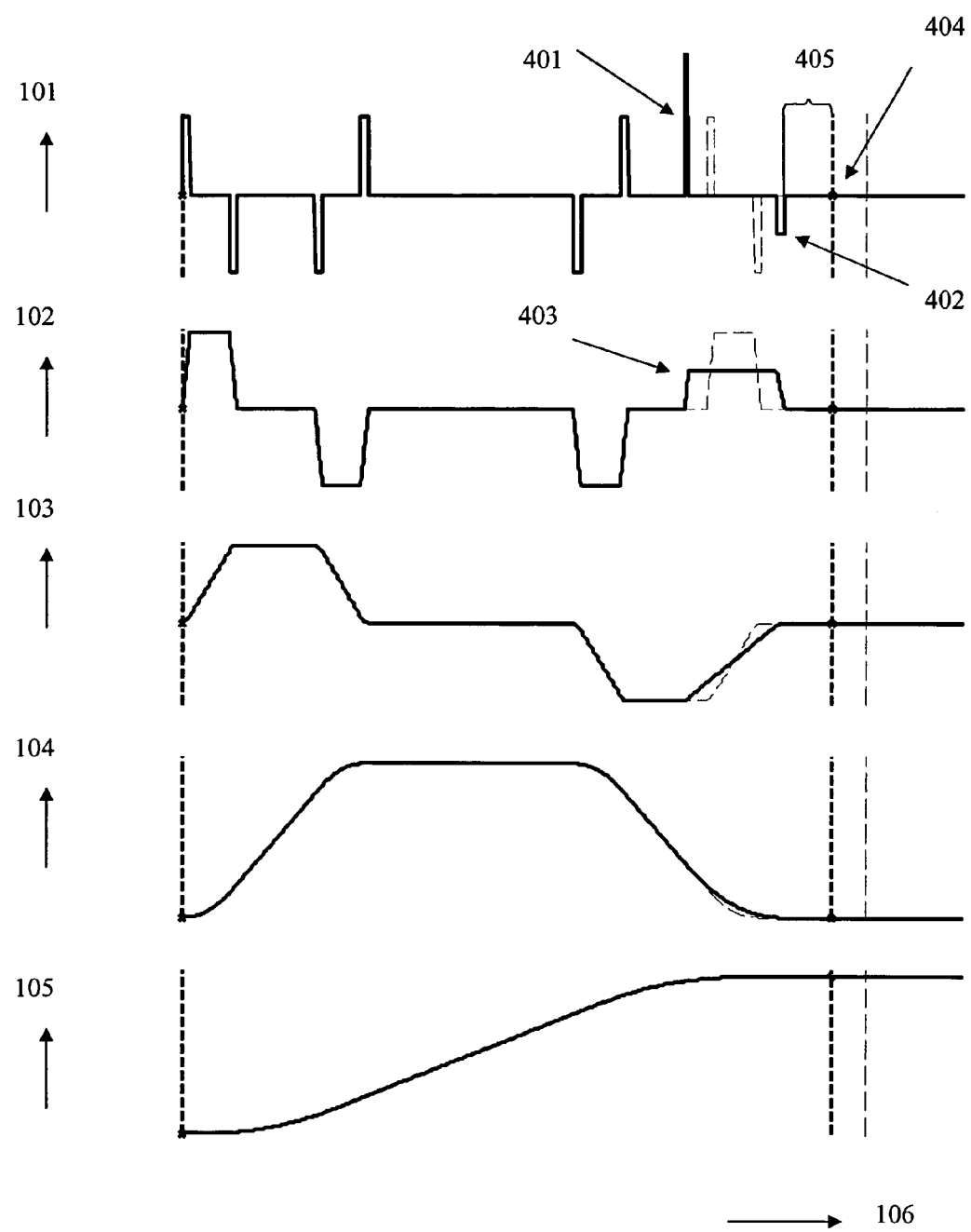
FIG. 7 depicts position, velocity, acceleration, jerk and derivative of jerk trajectory profiles according to another embodiment of the invention, showing the possible effect of temporarily reducing the maximal value of the derivative of jerk and of the jerk.

An example of this approach is given in FIG. 7, in which for the final phase of the movement before a stopping point, the maximal value of both the jerk and the derivative of jerk is reduced by 50%. This technique may applied to other points in a motion, including substantially constant velocity phases and non-critical phases. For comparison, the original profiles from FIG. 6 are indicated in FIG. 7 with dashed lines. As in FIG. 6, the specification of the derivative of jerk profile 101 leads to the jerk profile 102, the acceleration profile 103, the velocity profile 104, and the position 105 as a function of time 106. The reduced maximal value for the jerk 403 during the final jerk phase is obtained by shortening the duration of the derivative of jerk phase indicated as 401. During the final derivative of jerk phase 402, the maximal value for the derivative of jerk is also reduced. The timing of the new trajectory in FIG. 7 is adjusted such that the obtained position is equal to that of the original trajectory in FIG. 6. The final derivative of jerk phase of the new trajectory ends at a later time than that of the original trajectory, but due to the smoother profile the settling behavior will improve such that the duration of the settling period can be reduced from 302 in FIG. 6 to 405 in FIG. 7. Hence, the moment in time at which the required accuracy is obtained may be earlier than with the original trajectory as indicated by 404.

For each of the embodiments, a maximum (and/or minimum) on the absolute value of the derivative of jerk may provided, the value of this maximum (and/or minimum) being, for example, a design parameter. In other words, the maximum (and/or minimum) on the derivative of jerk may be set and configurable. Similarly, maximums (and/or minimums) on the absolute value of the velocity, acceleration and jerk of the planned trajectory may be provided. The maximums (and/or minimums) may be, for example, based on the allowable actuator performance, arbitrarily set, or set for performance reasons. In an embodiment, the maximal value of the derivative of jerk for a negative acceleration phase in a motion equals the maximal value of the derivative of jerk in a positive acceleration phase in the motion. Equally, the maximal values for the positive and negative acceleration phases of the motion may be different. In an embodiment, the maximal value for a negative acceleration in the motion is greater than or equal to 10 and less than or equal to 20 times the maximal value of a positive acceleration for starting the motion.

Further, in an embodiment, any of these maxima (and/or minima) may be temporarily reduced in order to, for example, obtain improved positioning accuracy, enable the coordination with other degrees of freedom of the movable part, and/or enable the coordination with the trajectory of a different movable part. Such a change of the bound of the velocity, acceleration, jerk and/or derivative of jerk maybe advantageously made at anytime during the trajectory when the value of the velocity, acceleration, jerk and/or derivative of jerk respectively is zero. When the value of the velocity, acceleration, jerk and/or derivative of jerk is zero, the respective bound can be safely changed without impacting performance.

In an embodiment, a profile for the derivative of jerk comprises consecutive time intervals with substantially constant absolute value. For example, a profile for the derivative of jerk may comprises consecutive time intervals with either maximal positive, maximal negative or zero value. In an embodiment, the maximal negative value may be substantially the same absolute value as the maximal positive value.

In an embodiment, the resulting trajectory can be made time optimal, given the bounds to be satisfied. In other words, values of the various profiles are configured to reduce the overall time of the movement.

In an embodiment, the principles discussed herein in relation to the embodiment using a maxima (and/or minima) of the derivative of jerk ("snap") may be extended by those skilled in the art to higher derivatives to time of the position of the motion. For example, maxima (and/or minima) may be applied to a fifth derivative to time of the position (second derivative of jerk) of the motion ("crackle") and to a sixth derivative to time of the position (third derivative of jerk) of the motion ("pop") and manipulated as discussed herein.

In an embodiment, the derivative of jerk (or higher order) of the motion limited by a boundary or maximum can be applied as a feed-forward signal to improve the control signal. Thus, a feed-forward part of the control signal may be based on a pre-specified relation between the derivative of jerk (or higher order) of the motion, limited by a boundary or a maximum, and the control signal. The second derivative of the position may also be applied as a feed-forward part of the control signal. Similarly, in addition or alternatively, a feedback part of the control signal may be based on a measured value of a characteristic (e.g., position or velocity) of the movable part in relation to a current desired value of that characteristic as specified by the motion signal (which may be the derivative of jerk (or higher order) of the motion, limited by a boundary or a maximum).

Figure 2:
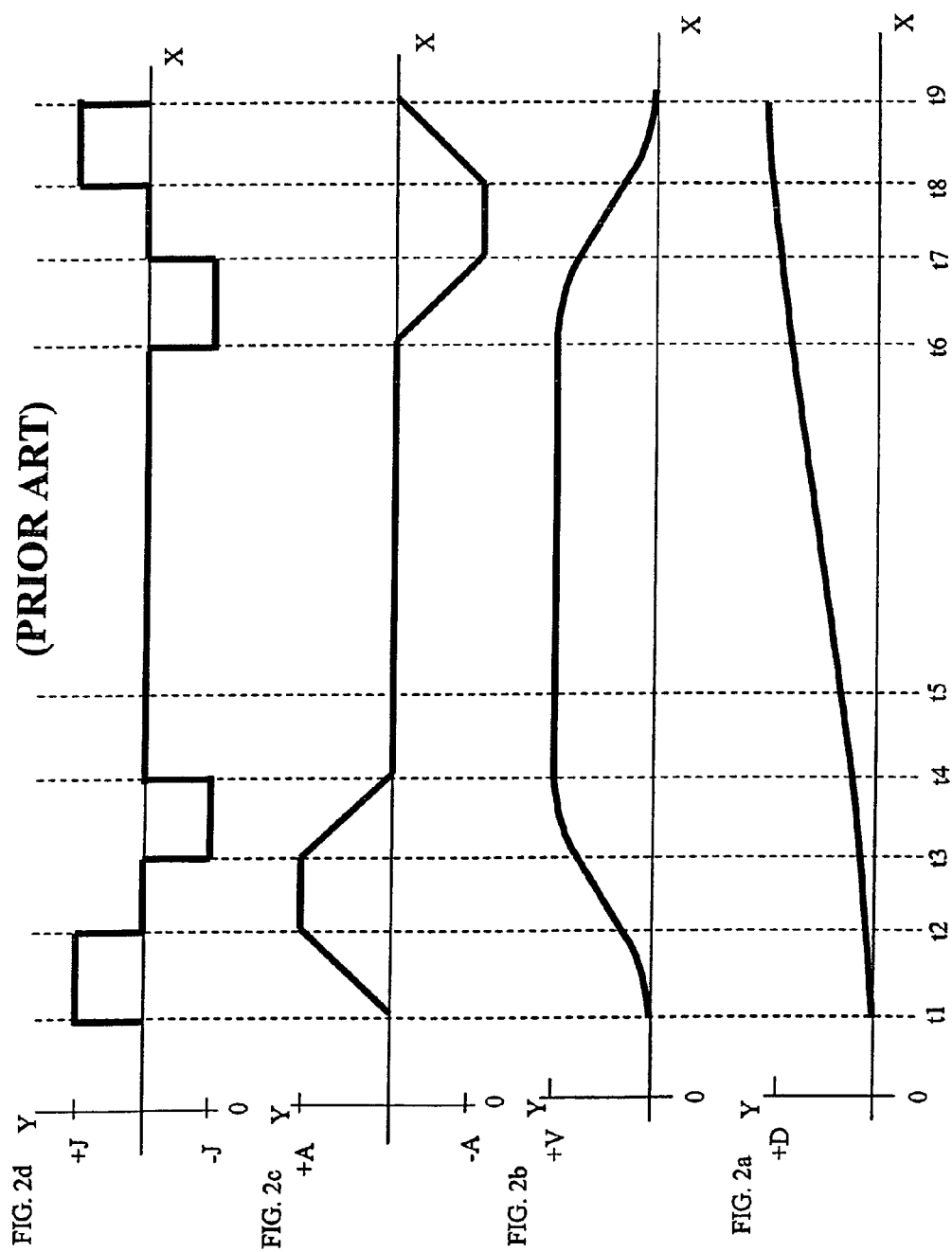
FIGS. 2a, 2b, 2c and 2d depict a trajectory of an object table during a scan according to the prior art.

According to another embodiment, settling behavior may be improved by changing the symmetry of all or a portion of a trajectory profile. For example, in a jerk ($3^{rd}$ order) set point generator (i.e., the trajectory profiles are determined from the specification of a jerk profile having a finite jerk) or a derivative of jerk ($4^{th}$ order) set point generator (as described above where the trajectory profiles are determined from the specification of a derivative of jerk profile having a finite derivative of jerk), a high jerk starting a positive or negative acceleration phase is combined with a low jerk ending the negative or positive acceleration phase. The high jerk is applied during a short time period and the low jerk during a long time period so that, for a jerk set point generator, the time integral for both high jerk and low jerk periods is the same. By providing a low jerk at the end of an acceleration phase, a shorter settling time may be obtained and possibly a higher throughput. In an embodiment, the total time to complete the application of the high and low jerk of a positive and/or negative acceleration phase does not exceed the total time of a positive or negative acceleration phase of a conventional trajectory profile, such as for example depicted in FIG. 2, in order to preserve throughput.

Figure 8A:
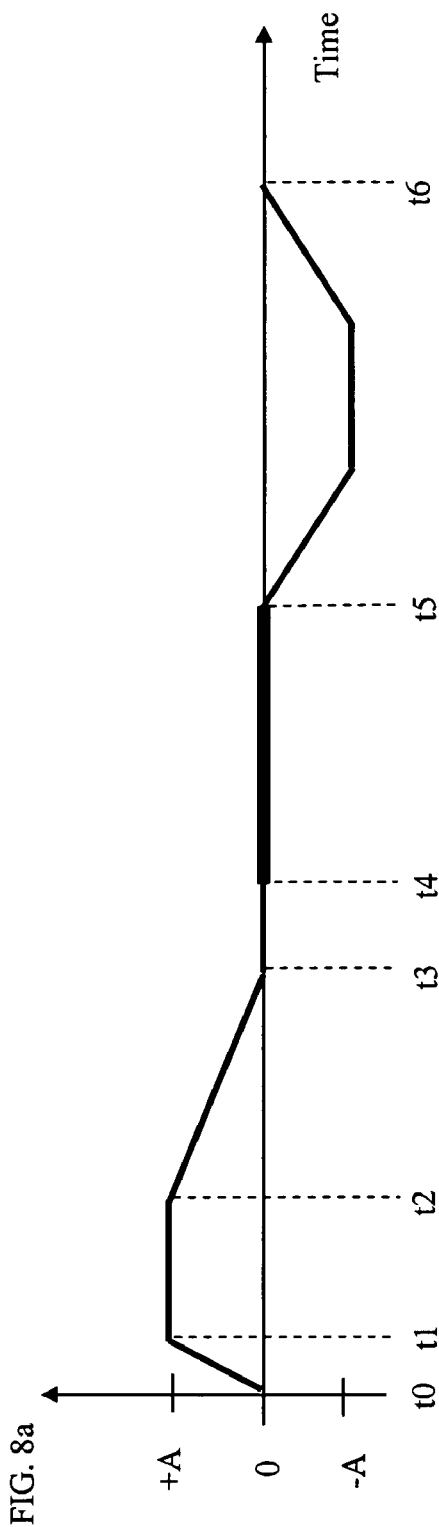
FIGS. 8a–8d depict acceleration trajectory profiles according to an embodiment of the invention.

FIG. 8a depicts an acceleration trajectory profile resulting from a non-symmetric jerk profile applied in a positive acceleration phase of a scanning object table in a lithographic apparatus. From time t0 to t1, the positive acceleration of the object table increases to maximum positive acceleration +A with a high jerk (i.e., the derivative of acceleration being relatively high compared to another period of the positive acceleration phase as reflected by the steep slope of the acceleration trajectory profile between times to and t1). From times t1 to t2, the object table positively accelerates at maximum positive acceleration +A. From times t2 to t3, the positive acceleration of the object table reduces with a low jerk (i.e., the derivative of acceleration being relatively low compared to another period of the positive acceleration phase as reflected by the less steep slope of the acceleration trajectory profile between times t2 and t3). As can be seen, the time period between times t0 and t1 is shorter than the period between times t2 and t3. The result is that between times t0 and t1 there is a high, fast jerk while between the times t2 and t3 there is low, slow jerk with, in a jerk set point generator, the time integral for both periods being the same.

Between times t3 and t4 of FIG. 8a, a settling period is provided which is shorter than a settling period of a conventional acceleration profile (such as depicted in FIG. 2c). Between times t4 and t5 of FIG. 8a, an exposure is performed at substantially constant velocity. Between times t5 and t6 of FIG. 8a, the object table is decelerated to zero velocity.

Figure 8B:
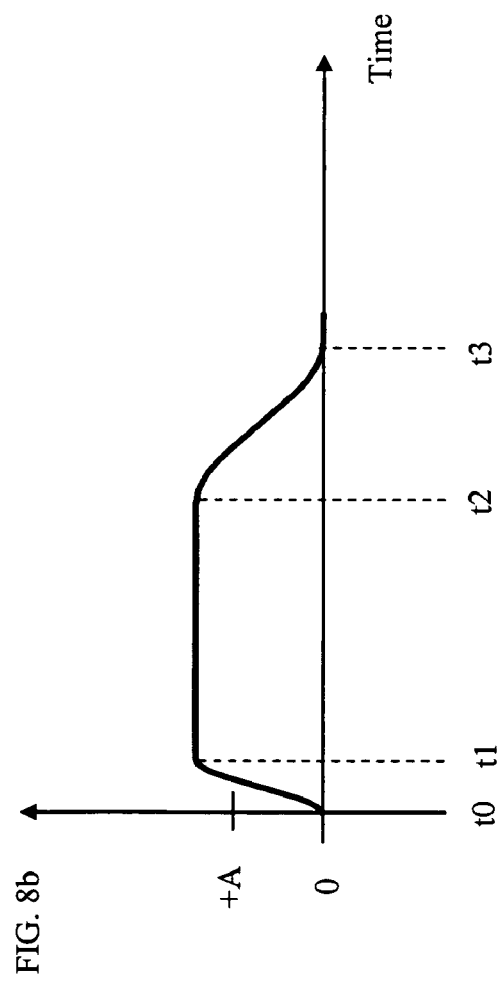

In FIG. 8a, the acceleration trajectory profile was generated using a jerk ($3^{rd}$ order) set point generator, i.e., the acceleration and other trajectory profiles (e.g., velocity and position) are determined from the specification of a jerk profile having a finite jerk. The acceleration trajectory profile may alternatively be generated using a derivative of jerk ($4^{th}$ order) set point generator, i.e., as described above where the acceleration and other trajectory profiles are determined from the specification of a derivative of jerk profile having a finite derivative of jerk. FIG. 8b shows an example non-symmetric positive acceleration phase (comparable to the non-symmetric positive acceleration phase between times t1 and t3 of FIG. 8a) generated using a $4^{th}$ order set point generator.

In a scanning object table embodiment, low jerk before exposure can reduce settling time but may increase cycle time. Throughput enhancement can be obtained if the settling time reduction leads to cycle time reduction, which can be achieved by increasing jerk, acceleration and velocity during non-critical phases (i.e., non-exposure periods such as a negative acceleration period after scanning and stepping).

Further, since the end of the negative acceleration phase of the scan is not sensitive to vibrations, a symmetric jerk profile can be applied to that negative acceleration phase. In other words, the positive and negative acceleration phases are non-symmetric as between themselves. For example, a conventional profile can be applied as seen in FIG. 2d to the negative acceleration phase, which leads to the acceleration profiles of the negative acceleration phases of FIGS. 2c and 8a. However, a non-symmetric jerk profile may be applied to a negative acceleration phase as well or alternatively.

Figure 8C:
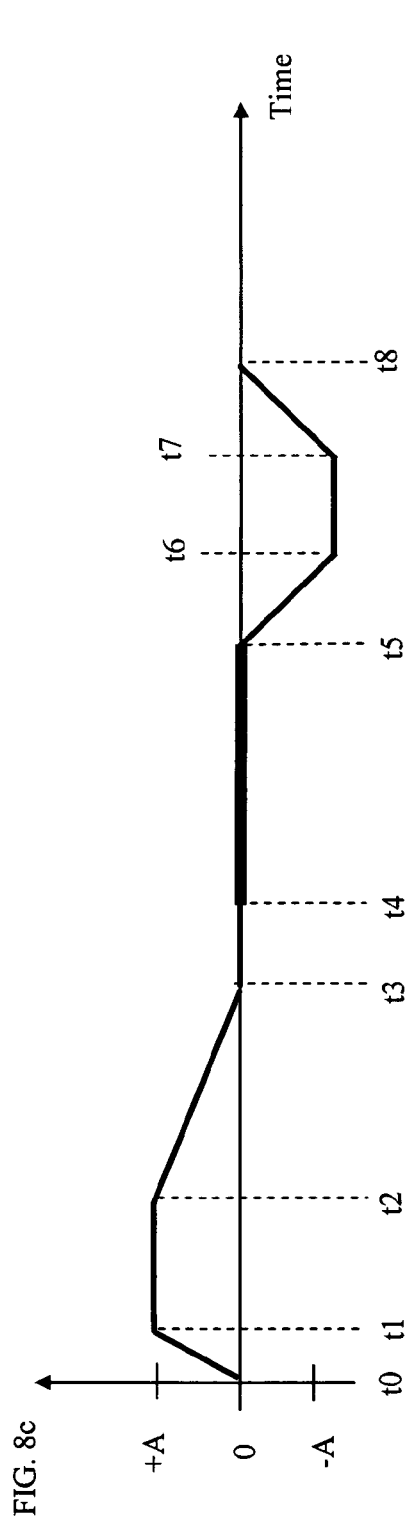

In another embodiment, the negative acceleration phase has a symmetric high jerk profile (although it may be non-symmetric). Further, the negative acceleration phase is non-symmetric with the positive acceleration phase (although it may be symmetric with the positive acceleration phase). In an implementation, the high jerk is the maximum jerk allowable and/or the value of jerk attainable when the derivative of the high jerk corresponds to a maximal allowable value and all other specifications of the trajectory are maintained. In a scanning object table embodiment, by having a high jerk, the scanning object table can be decelerated quickly, shortening the deceleration time, and enhancing overall throughput of the scanning object table. Referring to FIG. 8c, between the times t0 and t5, the acceleration profile is the same as with FIG. 8a. From time t5 to t6, the negative acceleration of the object table increases to maximum negative acceleration −A with a high jerk (i.e., the derivative of acceleration being high as reflected by the steep slope of the acceleration trajectory profile between times t5 and t6). From times t6 to t7, the object table negatively accelerates at maximum negative acceleration −A. From times t7 to t8, the negative acceleration of the object table reduces with a high jerk (i.e., the derivative of acceleration being high as reflected by the steep slope of the acceleration trajectory profile between times t7 and t8) to zero. As can be seen, the overall time t8 of the movement in FIG. 8c is shorter than the overall time t6 of the movement in FIG. 8a. This shortening of time can reduce the overall throughput of a scanning object table.

Figure 8D:
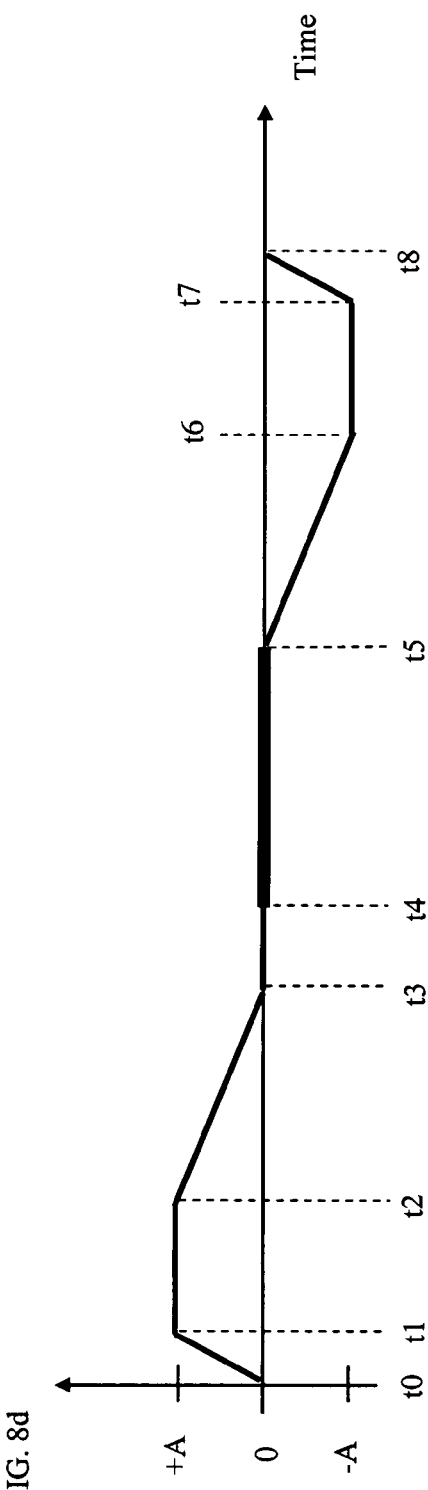

In a further embodiment, a negative acceleration phase has a non-symmetric jerk profile that is a symmetric mirror image of the positive acceleration phase. In a scanning object table embodiment, a negative acceleration phase that is symmetric with a positive acceleration phase allows for bi-directional scanning without impact on throughput as the positive and negative acceleration phase distances are the substantially the same. For example, referring to FIG. 8d, between the times t0 and t5, the acceleration profile is the same as with FIG. 8a. From time t5 to t6, the negative acceleration of the object table increases to maximum negative acceleration −A with a low jerk (i.e., the derivative of acceleration being relatively low compared to another period of the negative acceleration phase as reflected by the less steep slope of the acceleration trajectory profile between times t5 and t6). From times t6 to t7, the object table negatively accelerates at maximum negative acceleration −A. From times t7 to t8, the negative acceleration of the object table reduces with a high jerk (i.e., the derivative of acceleration being relatively high compared to another period of the negative acceleration phase as reflected by the steep slope of the acceleration trajectory profile between times t7 and t8) to zero. As can be seen, the time period between times t7 and t8 is shorter than the period between times t5 and t6. The result is that between times t7 and t8 there is a high, fast jerk while between the times t5 and t6 there is low, slow jerk with the product of jerk multiplied by the jerk time being the same for both periods. In a variant, the high jerk may be provided between times t5 and t6 and the low jerk applied between time t7 and t8.

Referring to FIGS. 9a–c, acceleration trajectory profiles of an object table performing both scanning and stepping operations are shown along with a physical depiction of the trajectory of the object table. According to this embodiment, a non-symmetric profile is also applied to a stepping operation. In FIGS. 9a–c, the non-symmetric profile is applied to both the X and Y movements of a step and scan operation although the non-symmetric profile may just be applied to an X or Y movement while a conventional (or any other) profile is applied to the other of the X or Y movement.

In FIG. 9a, a physical depiction of the trajectory of a scanning object table is shown. At point A, the object table has just completed an exposure (represented by the rectangle) and is about to proceed to step and begin another scanning exposure. From point A, the object table continues to move in the −Y direction to point B. From point B, the object table continues moving in the −Y direction (although it begins to decelerate in that direction) and starts to move in the +X direction. At a point in time, the object table starts to begin moving in the +Y direction while still moving in the +X direction. In an embodiment where a conventional step and scan profile is applied, the object table reaches point C where the object table no longer moves in the +X direction and moves only in the +Y direction. At point D, the object table reaches a substantially constant velocity and a scan exposure occurs between points D and E. Between points D' and D, a settling distance/period is provided in order to attain the substantially constant velocity required for between points D and E. The net result of this motion is a "U turn" so that scanning exposure is performed in a −Y direction for a field and then scanning exposure is performed in a +Y direction for another field.

Referring to FIG. 9b, an acceleration trajectory profile of the object table in the Y direction of FIG. 9a is depicted. The corresponding points A, B, D, D' and E of FIG. 9a are depicted at respective times on FIG. 9b. In FIG. 9b, a symmetric negative acceleration phase is provided from point A to point B. Then, a non-symmetric positive acceleration phase is provided comprising a high jerk (which in this example is practically infinite) at point B and a low jerk (which in this case is time-varying) between time t2 and the time at point D' (and a substantially constant positive acceleration between the time at point B and time t2). In this example, the positive and negative acceleration phases are non-symmetric with respect to each other. From point D' to D, a settling period is provided. From point D to point E, scanning exposure takes place in a +Y direction. Then, point E onwards, the negative and positive acceleration phases are repeated in a mirror image form to facilitate a "U turn" so scanning can be performed in the −Y direction.

Referring to FIG. 9c, an acceleration trajectory profile of the object table in the X direction of FIG. 9a is depicted. The corresponding points A, B, D, D' and E of FIG. 9a are depicted at respective times on FIG. 9c. In FIG. 9c, a symmetric positive acceleration phase is provided from the time at point B to time t1. Then, a non-symmetric negative acceleration phase is provided comprising a high jerk (which in this example is practically infinite) at time t2 and a low jerk (which in this case is time-varying) between time t2 and the time at point D' (and a substantially constant negative acceleration between time t1 and time t2). In this example, the positive and negative acceleration phases are non-symmetric with respect to each other. From point D' to D, a settling period is provided. From point D to point E, scanning exposure takes place in a +Y direction. So, in the Y direction, the velocity is constant during the D'–E time interval. In the X direction, the position is constant during the D' and E time interval. Then, point E onwards, the positive and negative acceleration phases are repeated in a mirror image form to facilitate a "U turn" so scanning can be performed in the −Y direction.

Referring to FIG. 9a, the physical effect of the trajectory profile of FIGS. 9b and 9c compared to a conventional scan profile are depicted, wherein in both profiles an adequate settling period is provided to allow for substantially constant velocity for a scanning exposure. Trajectory 1 corresponds to the acceleration trajectory profiles of FIGS. 9b and 9c. Trajectory 2 corresponds to a conventional scanning profile. Since a shorter settling period is attainable with FIGS. 9b and 9c, the "U turn" can be accomplished with the profile of FIGS. 9b and 9c in a shorter distance 3 than with a conventional profile, which can lead to reduced cycle time and higher throughput.

In an embodiment, the principles discussed herein in relation using a high/low jerk, symmetric/non-symmetric jerk acceleration phases and/or symmetry/non-symmetry of jerk between acceleration phases may be extended by those skilled in the art beyond jerk to higher derivatives to time of the position of the motion. For example, these principles may be applied using a fourth derivative to time of the position (derivative of jerk) of the motion ("snap"), fifth derivative to time of the position (second derivative of jerk) of the motion ("crackle") and to a sixth derivative to time of the position (third derivative of jerk) of the motion ("pop").

Further, these principles can be applied in any suitable combination with any or all of these derivatives to time of the position of the motion.

While the description herein has focused on the scanning technique and the movement of a mask and/or substrate as part of such a scanning technique, it will be apparent that the embodiments described herein can equally be applied to other techniques and other moving parts of a lithographic apparatus (or, for that matter, any other machine). For example, the embodiments may be applied to a step-and-repeat technique of a lithographic apparatus. Further, the embodiments may be applied to other movable parts of lithographic apparatus such as actuated projection system elements, a reticle masking apparatus or a substrate handling robot. In each case, the settling period can be defined at the end position or an intermediate position of the trajectory. So, for example, the non-symmetric profile (whether of a positive or negative acceleration phase or as between an positive acceleration phase and a negative acceleration phase) may be applied to any movable part, whether in a lithographic apparatus or not.

As used herein, the term "computer program product" is used to generally refer to a software program, computer useable media comprising the software program, memory comprising the software program or a carrier wave carrying the software program over a (wireless or cable) communication path. A computer useable medium can include magnetic media, optical media, or other recordable media, or media that transmits a carrier wave. In an embodiment implemented using a software program in a lithographic apparatus, the software program can be provided in the lithographic apparatus or loaded into the lithographic apparatus via computer useable media, a memory or a carrier wave.

While specific embodiments of the invention have been described above, it will be appreciated that the invention may be practiced otherwise than as described. The description is not intended to limit the invention.

What is claimed is:

1. A lithographic projection apparatus, comprising:
   a support structure configured to hold a patterning device, the patterning device configured to pattern a beam of radiation;
   a substrate table configured to hold a substrate;
   an actuator configured to move the support structure, the substrate table, or both;
   a controller configured to provide a motion signal to the actuator, the motion signal controlling the actuator to produce a motion of the support structure, the substrate table, or both, an absolute value of a fourth, a higher than fourth, or both, derivative to time of the position of the motion being limited to less than a maximal finite value; and
   a projection system configured to project the patterned beam onto a target portion of the substrate.

2. The apparatus of claim 1, wherein the motion signal comprises a motion signal for a desired position of the support structure, the substrate table, or both.

3. The apparatus of claim 2, comprising a trajectory planner configured to generate the motion signal by constructing a function of time that is to serve as the $n^{th}$ derivative to time of the motion signal and integrating the constructed function n times, where $n \geq 4$.

4. The apparatus of claim 3, wherein constructing the function of time comprises defining consecutive time intervals with a substantially constant function value.

5. The apparatus of claim 4, wherein the substantially constant function value in each consecutive time interval is either a maximal positive value, a maximal negative value of the substantially same absolute value as the maximal positive value, or zero.

6. The apparatus of claim 3, wherein intermediate results of integrating the constructed function of time are determined, including a jerk profile, an acceleration profile, a velocity profile, and a position profile, the position profile corresponding to the motion signal, as respective integrals of the constructed function of time.

7. The apparatus of claim 6, wherein an absolute value of (i) the jerk profile, (ii) the acceleration profile, (iii) the velocity profile, (iv) the position profile, or (v) any combination of (i)–(iv) is limited to less than a maximal finite value.

8. The apparatus of claim 1, wherein the maximal value in advance of a substantially constant velocity phase, a stopping point, or both, of the motion is less than the maximal value of another part of the motion.

9. The apparatus of claim 8, wherein the maximal value in advance of the substantially constant velocity phase, the stopping point, or both, is less than or equal to 25% of the maximum value of another part of the motion.

10. The apparatus of claim 8, wherein the maximal value in advance of the stopping point is less than or equal to 50% of the maximal value of another part of the motion and a maximal value of the jerk of the motion in advance of the stopping point is less than or equal to 50% of the maximal value of the jerk of another part of the motion.

11. The apparatus of claim 1, wherein the motion of the support structure, the substrate table, or both, is in a scanning direction.

12. The apparatus of claim 1, wherein the motion of the substrate table is in a stepping direction.

13. The apparatus of claim 1, wherein the motion of the substrate table is in a stepping direction and in a scanning direction.

14. The apparatus of claim 1, wherein the maximal value for a negative acceleration phase in the motion equals the maximal value of a positive acceleration phase in the motion.

15. The apparatus of claim 1, wherein the maximal value for a negative acceleration in the motion is greater than or equal to 10 and less than or equal to 20 times the maximal value of a positive acceleration for starting the motion.

16. The apparatus of claim 1, wherein the motion signal is determined using a feed-forward comprising a fourth, a higher than fourth, or both, derivative to time of the position of the motion limited to less than a maximal finite value.

17. A lithographic apparatus, comprising:
   a support structure configured to hold a patterning device, the patterning device configured to pattern a beam of radiation;
   a substrate table configured to hold a substrate;
   an actuator configured to move a part of the lithographic apparatus in at least one degree of freedom in accordance with a set-point signal for a desired position of the part, a fourth, a higher than fourth, or both, derivative to time of the set-point signal being limited to a boundary; and
   a projection system configured to project the patterned beam onto a target portion of the substrate.

18. A computer program product to control motion of a substrate table, a patterning device support structure, or both, in a lithographic apparatus, comprising software code configured to generate motion data used to control an actuator to produce a motion of the support structure, the substrate table, or both, an absolute value of a fourth, a higher than fourth, or both, derivative to time of the position of the motion being limited to less than a maximal finite value.

19. The computer program product of claim 18, comprising software code configured to provide a motion signal for an actuator, said motion signal corresponding to a desired position of the support structure, the substrate table, or both.

20. The computer program product of claim 18, wherein the maximal value in advance of a substantially constant velocity phase, a stopping point, or both, of the motion is less than the maximal value of another part of the motion.

21. The computer program product of claim 18, wherein the motion of the support structure, the substrate table, or both, is in a scanning direction of the lithographic apparatus.

22. The computer program product of claim 18, wherein the motion of the substrate table is in a stepping direction of the lithographic apparatus.

23. The computer program product of claim 18, wherein the motion of the substrate table is in a stepping direction and in a scanning direction of the lithographic apparatus.

24. The computer program product of claim 18, wherein the motion signal is determined using a feed-forward comprising a fourth, a higher than fourth, or both, derivative to time of the position of the motion limited to less than a maximal finite value.

25. A device manufacturing method comprising:
actuating a mask table, a substrate table, or both, of a lithographic apparatus in at least one degree of freedom using a set-point signal for the desired position of the mask table, the substrate table, or both, a fourth, a higher than fourth, or both, derivative to time of the set-point signal being limited to a finite maximum; and
projecting a patterned beam of radiation onto a target portion of a substrate held by the substrate table.

26. The method of claim 25, wherein the degree of freedom includes a scanning direction of the lithographic apparatus.

27. The method of claim 25, wherein the degree of freedom includes a stepping direction of the lithographic apparatus.

28. The method of claim 25, comprising reducing the maximal value in advance of a substantially constant velocity phase, a stopping point, or both, of the motion to less than the maximal value of another part of the motion.

29. The method of claim 25, wherein the set-point signal is determined using a feed-forward comprising a fourth, a higher than fourth, or both, derivative to time of the set-point signal limited to a finite maximum.

30. A lithographic projection apparatus, comprising:
a support structure configured to hold a patterning device, the patterning device configured to pattern a beam of radiation;
a substrate table configured to hold a substrate;
an actuator connected to the support structure, the substrate table, or both;
a controller configured to provide a motion signal to the actuator, the motion signal controlling the actuator to produce an acceleration of the support structure, the substrate table, or both, having a high third, a higher than third, or both, derivative to time of the position of the motion at a start portion of the acceleration and a corresponding low third, higher than third, or both, derivative to time of the position of the motion at an end portion of the acceleration, the absolute value of the high third, higher than third, or both, derivative to time of the position of the motion being larger than the absolute value of the corresponding low third, higher than third, or both, derivative to time of the position of the motion; and
a projection system configured to project the patterned beam onto a target portion of the substrate.

31. The apparatus of claim 30, wherein the absolute value of the third derivative to time of the position of the motion is less than a maximal finite value.

32. The apparatus of claim 30, wherein the absolute value of a fourth, a higher than fourth, or both, derivative to time of the position of the motion is less than a maximal finite value.

33. The apparatus of claim 30, wherein the motion signal controls the actuator to produce acceleration having a corresponding substantially zero third, higher than third, or both, derivative to time of the position of the motion for an intermediate period between the start portion and the end portion.

34. The apparatus of claim 30, wherein the acceleration is a positive acceleration and the controller is further configured to provide a motion signal to the actuator, the motion signal controlling the actuator to produce a negative acceleration of the support structure, the substrate table, or both, having a high negative acceleration third, higher than third, or both, derivative to time of the position of the motion, the absolute value of the high negative acceleration third, higher than third, or both, derivative to time of the position of the motion being larger than the absolute value of the corresponding low third, higher than third, or both, derivative to time of the position of the motion.

35. The apparatus of claim 34, wherein the negative acceleration comprises the high negative acceleration third, higher than third, or both, derivative to time of the position of the motion for a start period and the high negative acceleration third, higher than third, or both, derivative to time of the position of the motion for an end period.

36. The apparatus of claim 35, wherein the negative acceleration comprises a corresponding substantially zero third, higher than third, or both derivative to time of the position of the motion for an intermediate period between the start period and the end period.

37. The apparatus of claim 30, wherein the acceleration is a positive acceleration and the controller is further configured to provide a motion signal to the actuator, the motion signal controlling the actuator to produce a negative acceleration of the support structure, the substrate table, or both, having a low negative acceleration third, higher than third, or both, derivative to time of the position of the motion at a start period of the negative acceleration and a corresponding high negative acceleration third, higher than third, or both, derivative to time of the position of the motion, the absolute value of the corresponding high negative acceleration third, higher than third, or both, derivative to time of the position of the motion being larger than the absolute value of the low negative acceleration third, higher than third, or both, derivative to time of the position of the motion.

38. The apparatus of claim 30, wherein the acceleration comprises a positive acceleration phase and negative acceleration phase.

39. The apparatus of claim 30, wherein the acceleration comprises a scanning direction.

40. The apparatus of claim 30, wherein the acceleration comprises a stepping direction.

41. The apparatus of claim 40, wherein the acceleration further comprises a scanning direction.

42. The apparatus of claim 30, wherein the motion signal comprises a position signal.

43. A computer program product to control motion of a patterning device support structure, and a substrate table, or both, in a lithographic apparatus, comprising software code configured to generate motion data used to control an actuator to produce an acceleration of the patterning device support structure, the substrate table, or both, having a high third, higher than third, or both, derivative to time of the position of the motion at a start portion of the acceleration and a corresponding low third, higher than third, or both, derivative to time of the position of the motion at an end portion of the acceleration, the absolute value of the high third, higher than third, or both, derivative to time of the position of the motion being larger than the absolute value of the corresponding low third, higher than third, or both, derivative to time of the position of the motion.

44. The computer program product of claim 43, wherein the absolute value of the third derivative to time of the position of the motion is less than a maximal finite value.

45. The computer program product of claim 43, wherein the absolute value of a fourth, a higher than fourth, or both, derivative to time of the position of the motion is less than a maximal finite value.

46. The computer program product of claim 43, comprising software code configured to produce motion data used to control an actuator to produce an acceleration having a corresponding substantially zero third, higher than third, or both, derivative to time of the position of the motion for an intermediate period between the start portion and the end portion.

47. The computer program product of claim 43, wherein the acceleration is a positive acceleration and comprising software code configured to produce motion data used to control an actuator to produce a negative acceleration of the patterning device support structure, the substrate table, or both, having a high negative acceleration third, higher than third, or both, derivative to time of the position of the motion, the absolute value of the high negative acceleration third, higher than third, or both, derivative to time of the position of the motion being larger than the absolute value of the corresponding low third, higher than third, or both, derivative to time of the position of the motion.

48. The computer program product of claim 43, wherein the acceleration is a positive acceleration and comprising software code configured to produce motion data used to control an actuator to produce a negative acceleration of the patterning device support structure, the substrate table, or both, having a low negative acceleration third, higher than third, or both, derivative to time of the position of the motion at a start period of the negative acceleration and a corresponding high negative acceleration third, higher than third, or both, derivative to time of the position of the motion at an end period of the negative acceleration, the absolute value of the corresponding high negative acceleration third, higher than third, or both, derivative to time of the position of the motion being larger than the absolute value of the low negative acceleration third, higher than third, or both, derivative to time of the position of the motion.

49. The computer program product of claim 43, wherein the acceleration comprises a positive acceleration phase and negative acceleration phase.

50. The computer program product of claim 43, wherein the acceleration comprises a scanning direction.

51. The computer program product of claim 43, wherein the acceleration comprises a stepping direction.

52. The computer program product of claim 43, wherein the motion signal comprises a position signal.

* * * * *